United States Patent
Noh et al.

(10) Patent No.: US 11,645,981 B2
(45) Date of Patent: May 9, 2023

(54) GATE DRIVER AND DISPLAY PANEL INCLUDING THE SAME

(71) Applicant: LG Display Co., Ltd., Seoul (KR)

(72) Inventors: Seok Noh, Paju-si (KR); Ki Min Son, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/860,085

(22) Filed: Jul. 7, 2022

(65) Prior Publication Data

US 2023/0009494 A1 Jan. 12, 2023

(30) Foreign Application Priority Data

Jul. 8, 2021 (KR) .......................... 10-2021-0090005
Dec. 3, 2021 (KR) .......................... 10-2021-0171605

(51) Int. Cl.
*G09G 3/3266* (2016.01)
*G09G 3/3233* (2016.01)

(52) U.S. Cl.
CPC ......... *G09G 3/3266* (2013.01); *G09G 3/3233* (2013.01); *G09G 2300/0819* (2013.01); *G09G 2300/0842* (2013.01); *G09G 2300/0861* (2013.01); *G09G 2310/027* (2013.01); *G09G 2310/0291* (2013.01);
(Continued)

(58) Field of Classification Search
None
See application file for complete search history.

(56) References Cited

U.S. PATENT DOCUMENTS 9,418,755 B2 8/2016 So et al.
2017/0004760 A1* 1/2017 Jang ...................... G09G 3/3677
(Continued)

FOREIGN PATENT DOCUMENTS

CN 109448656 B 1/2021
KR 10-2017-0102148 A 9/2017
KR 10-2020-0111864 A 10/2020

*Primary Examiner* — Christopher J Kohlman
(74) *Attorney, Agent, or Firm* — Seed IP Law Group LLP

(57) ABSTRACT

Disclosed are a gate driver and a display panel including the same. The gate driver according to an embodiment includes a plurality of signal transfer units cascade-connected via a carry line to which a carry signal is applied from a previous signal transfer unit, and an $n^{th}$ (n is a positive integer) signal transfer unit includes a first output unit configured to output a first gate signal to a first output node according to a voltage of a first control node configured to pull up an output voltage and a second control node configured to pull down the output voltage; and a second output unit configured to output a second gate signal in which a phase of the first gate signal is reversed to a second output node, wherein the second output unit may include a first pull-up transistor configured to output a high potential voltage to the second output node according to a voltage of a second control node of an $(n-i)^{th}$ (i is a positive integer less than n) signal transfer unit; and a second pull-down transistor configured to output a first low potential voltage to the second output node according to a voltage of a first control node of an $(n+j)^{th}$ (j is a natural number greater than n) signal transfer unit.

21 Claims, 11 Drawing Sheets

(52) U.S. Cl.
CPC . *G09G 2310/0297* (2013.01); *G09G 2310/08* (2013.01); *G09G 2320/0673* (2013.01)

(56) References Cited

U.S. PATENT DOCUMENTS

| | | | |
|---|---|---|---|
| 2018/0144685 A1 | 5/2018 | Gong et al. | |
| 2020/0302875 A1 | 9/2020 | Park et al. | |
| 2021/0358367 A1* | 11/2021 | Zheng | G09G 3/20 |
| 2022/0208052 A1* | 6/2022 | Jang | G09G 3/3266 |

* cited by examiner

GATE DRIVER AND DISPLAY PANEL INCLUDING THE SAME

CROSS-REFERENCE TO RELATED APPLICATION

This application claims priority to and the benefit of Korean Patent Application No. 10-2021-0090005, filed on Jul. 8, 2021, and Korean Patent Application No. 10-2021-0171605, filed on Dec. 3, 2021, the disclosure of which is incorporated herein by reference in its entirety.

BACKGROUND

Technical Field

The present disclosure relates to a gate driver and a display panel including the same.

Description of Related Art

Display devices include a liquid crystal display (LCD) device, an electroluminescence display device, a field emission display (FED) device, a plasma display panel (PDP), and the like.

Electroluminescent display devices are divided into inorganic light emitting display devices and organic light emitting display devices according to a material of a light emitting layer. An active-matrix type organic light emitting display device reproduces an input image using a self-emissive element which emits light by itself, for example, an organic light emitting diode (hereinafter referred to as an "OLED"). An organic light emitting display device has advantages in that a response speed is fast and luminous efficiency, luminance, and a viewing angle are large.

Some of display devices, for example, a liquid crystal display device or an organic light emitting display device includes a display panel including a plurality of sub-pixels, a driver outputting a driving signal for driving the display panel, a power supply generating power to be supplied to the display panel or the driver, and the like. The driver includes a gate driver that supplies a scan signal or a gate signal to the display panel, and a data driver that supplies a data signal to the display panel.

In such a display device, when driving signals, such as a scan signal, an emission control (or "EM") signal, and a data signal, are supplied to a plurality of sub-pixels formed in the display panel, the selected sub-pixel transmits light or emits light directly to thereby display an image.

BRIEF SUMMARY

The inventors have realized that, as the number of signals used to drive the display device increases, a bezel of the display panel becomes wider. For example, it may be beneficial for a gate signal to include two signals having reversed phase from each other and different pulse widths. Therefore, there is a need for gate drivers and methods that are capable of outputting various gate signals that differ in at least one of a phase and a pulse width while implementing a narrow bezel.

The present disclosure is directed to solving all the above-described problems.

The present disclosure provides a gate driver capable of outputting various gate signals that differ in at least one of a phase and a pulse width while implementing a narrow bezel, and a display panel including the same.

It should be noted that benefits of the present disclosure are not limited to the above-described benefits, and other benefits of the present disclosure will be apparent to those skilled in the art from the following descriptions.

A gate driver of the present disclosure includes a plurality of signal transfer circuitry cascade-connected via a plurality of carry lines, each of the plurality of carry lines, in operation, outputting a carry signal to a respective first one of the plurality of signal transfer circuitry from a respective second one of the plurality of signal transfer circuitry that is previous the first one. An $n^{th}$ (n is a positive integer) signal transfer circuitry of the plurality of signal transfer circuitry includes first output circuitry and second output circuitry. The first output circuitry is configured to output a first gate signal to a first output node according to voltages of a first control node and a second control node, the first control node being configured to pull up an output voltage, the second control node being configured to pull down the output voltage. The second output unit is configured to output a second gate signal to a second output node, the second gate signal having phase reverse that of the first gate signal. The second output unit includes a first pull-up transistor configured to output a high potential voltage to the second output node according to a voltage of a second control node of $(n-i)^{th}$ (i is a positive integer less than n) signal transfer circuitry, and a second pull-down transistor configured to output a first low potential voltage to the second output node according to a voltage of a first control node of $(n+j)^{th}$ (j is a positive integer) signal transfer circuitry.

In another aspect, a display panel of the present disclosure comprises a data driver and a gate driver. The data driver is configured to output a data voltage. The gate driver includes a plurality of signal transfer circuitry cascade-connected via a plurality of carry lines, each of the plurality of carry lines, in operation, outputting a carry signal to a respective first one of the plurality of signal transfer circuitry from a respective second one of the plurality of signal transfer circuitry that is previous the first one. An $n^{th}$ signal transfer circuitry of the plurality of signal transfer circuitry includes: first output circuitry and second output circuitry. The first output circuitry is configured to output a first gate signal to a first output node according to voltages of a first control node and a second control node, the first control node being configured to pull up an output voltage, the second control node being configured to pull down the output voltage. The second output circuitry is configured to output a second gate signal to a second output node, the second gate signal having phase reverse that of the first gate signal. The display panel further includes a plurality of pixel circuits configured to reproduce an input image by receiving the data voltage, the first gate signal, and the second gate signal, wherein the second output circuitry includes: a first pull-up transistor configured to output a high potential voltage to the second output node according to a voltage of a second control node of $(n-i)^{th}$ signal transfer circuitry; and a first pull-down transistor configured to output a first low potential voltage to the second output node according to a voltage of a first control node of $(n+j)^{th}$ signal transfer circuitry, wherein n is a positive integer, i is a positive integer less than n and j is a positive integer.

According to the present disclosure, it is possible to output a reversed phase gate signal beneficial for driving a pixel circuit without adding a shift register to a gate driver.

According to the present disclosure, it is possible to output an in-phase gate signal using a single shift register and simultaneously output a reversed phase gate signal with easy pulse width adjustment.

According to the present disclosure, since there is no need to add a separate shift register for outputting a reversed phase gate signal to a gate driver by outputting various gate signals that differ in at least one of a phase and a pulse width through a single shift register, it is possible to implement a narrow bezel of a display panel in which the shift register of the gate driver is disposed.

Effects of the present disclosure are not limited to the effects mentioned above, and other effects not mentioned will be clearly understood by those skilled in the art from the description of the claims.

BRIEF DESCRIPTION OF THE SEVERAL VIEWS OF THE DRAWINGS

The above and other benefits, features and advantages of the present disclosure will become more apparent to those of ordinary skill in the art by describing in detail embodiments thereof with reference to the accompanying drawings, in which.

DETAILED DESCRIPTION

Figure 1:
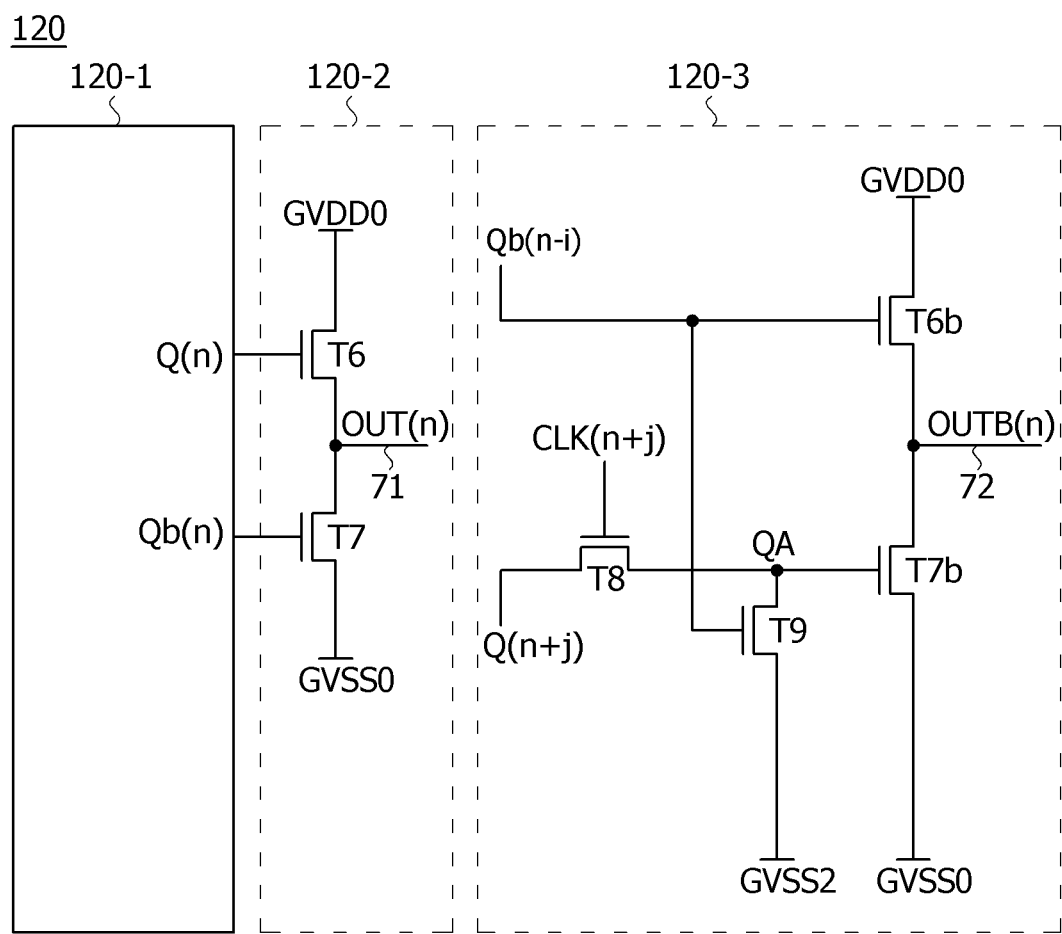
FIG. 1 is a view illustrating a gate driver according to a first embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The same reference numerals may refer to substantially the same elements throughout the present disclosure.

The following embodiments can be partially or entirely bonded to or combined with each other and can be linked and operated in technically various ways. The embodiments can be carried out independently of or in association with each other.

Hereinafter, various embodiments of the present disclosure will be described in detail with reference to the accompanying drawings.

Figure 2:
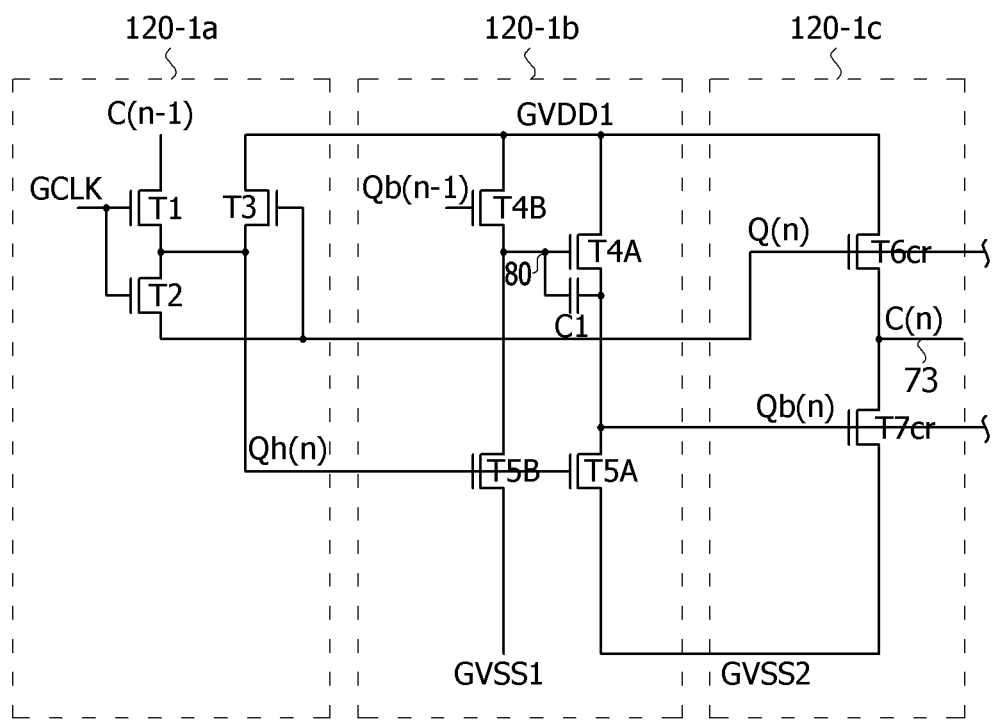
FIG. 2 is a circuit diagram illustrating a circuit unit shown in FIG. 1.
Figure 3:
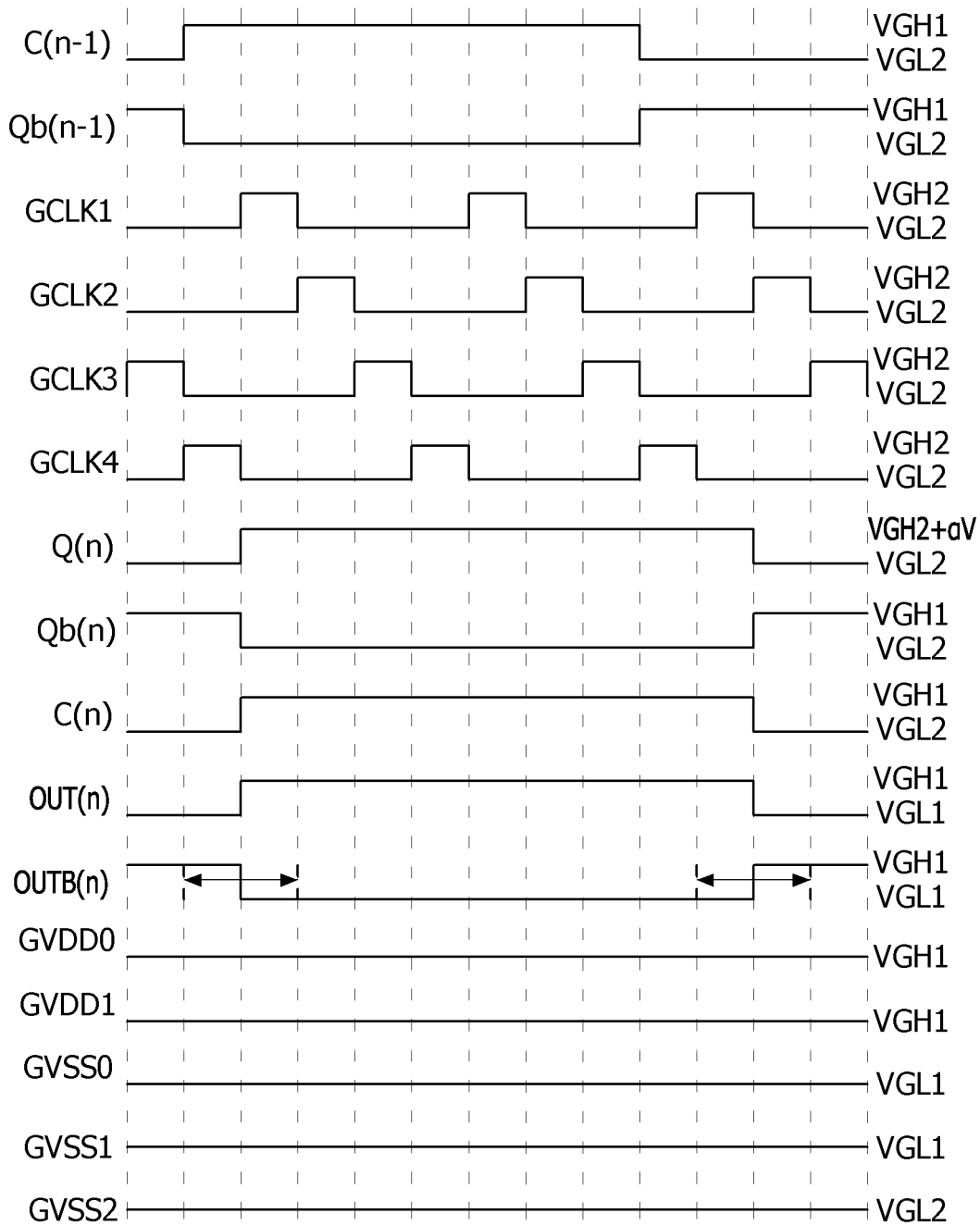
FIG. 3 is a waveform diagram illustrating input/output signals and voltages of control nodes of the gate driver shown in FIG. 1.

FIG. 1 is a view illustrating a gate driver according to a first embodiment of the present disclosure, FIG. 2 is a circuit diagram illustrating a circuit unit or circuitry shown in FIG. 1, and FIG. 3 is a waveform diagram illustrating input/output signals and voltages of control nodes of the gate driver shown in FIG. 1.

Referring to FIGS. 1 to 3, a gate driver 120 according to an embodiment of the present disclosure may include a first control node (hereinafter referred to as a "Q node") for pulling up an output voltage, a second control node (hereinafter referred to as a "Qb node") for pulling down the output voltage, a circuit unit or circuitry 120-1, a first output unit or circuitry 120-2, and a second output unit or circuitry 120-3. Reference is made throughout the disclosure to various "units," including the circuit unit 120-1, the first output unit 120-2, the second output unit 120-3, first, second and third circuit units 120-1a, 120-1b, 120-1c, signal processing units, and the like. It should be understood that "units" includes the meaning of circuitry. For example, the circuit unit 120-1 may be circuitry 120-1, the first output unit 120-2 may be first output circuitry 120-2, the signal processing units may be signal processors or signal processing circuitry (e.g., $n^{th}$ signal processing circuitry ST(n)), and the like.

The circuit unit 120-1 may charge and discharge the Q node Q(n) and the Qb node Qb(n), and output a carry signal C(n) according to potentials of the Q node Q(n) and the Qb node Qb(n). The circuit unit 120-1 may include a first circuit unit or circuitry 120-1a, a second circuit unit or circuitry 120-1b, and a third circuit unit or circuitry 120-1c.

The first circuit unit 120-1a serves to control charging and discharging of the Q node Q(n) and the Qb node Qb(n). When a shift clock GCLK1 is a high voltage VGH2 equal to or greater than a gate-on voltage VEH, the first circuit unit 120-1a charges a Q node Q(n) by supplying a voltage of an (n-1)$^{th}$ carry signal C(n-1) from an (n-1)$^{th}$ signal processing unit ST(n-1) (or "signal processor" or "signal processing circuitry"), which is a previous signal processing unit, to the Q node Q(n). The first circuit unit 120-1a includes first to third transistors T1, T2 and T3.

The first transistor T1 is turned on when the shift clock GCLK1 is the high voltage VGH2 equal to or greater than the gate-on voltage VEH and supplies the voltage of the carry signal C(n-1) to a Qh node Qh(n). The first transistor T1 includes a gate to which the shift clock GCLK1 is applied, a first electrode connected to the (n-1)$^{th}$ carry signal line 73, and a second electrode connected to the Qh node Qh(n).

The high voltage VGH2 of the shift clock GCLK1 may be set to a voltage lower than a second high potential voltage VGH1. The high voltage VGH1 of the carry signal C(n-1) and a first gate signal OUT(n) is the same voltage as the second high potential voltage VGH1. When the high voltage VGH2 of the shift clock GCLK1 is set lower than the second high potential voltage VGH1, the Q node Q(n) is floated when a threshold voltage Vth of the first transistor T1 is shifted to a negative polarity -Vth while the Q node Q(n) is charged, so that the voltage boosting of the Q node Q(n) may be better.

The second transistor T2 is turned on when the shift clock GCLK1 has the voltage VGH2 equal to or greater than the gate-on voltage VEH, and charges the Q node by supplying the voltage of the Qh node Qh(n) to the Q node Q(n). The second transistor T2 includes a gate to which the shift clock GCLK1 is applied, a first electrode connected to the Qh node Qh(n), and a second electrode connected to the Q node Q(n).

The first and second transistors T1 and T2 are connected in series. The first and second transistors T1 and T2 are connected in series between the (n-1)$^{th}$ carry signal line 73 and the Qh node Qh(n).

The third transistor T3 is turned on when the Q node Q(n) is charged and supplies the second high potential voltage to the Qh node Qh(n) through a second high potential voltage line GVDD1. The second high potential voltage is supplied to the Qh node Qh(n) through the second high potential voltage line GVDD1. The third transistor T3 includes a gate connected to the Q node Q(n), a first electrode connected to the second high potential voltage line GVDD1, and a second electrode connected to the Qh node Qh(n).

The second circuit unit 120-1b includes an inverter circuit that inverts the voltage of the Q node Q(n) and applies the voltage to a Qb node Qb(n). The inverter circuit of the second circuit unit 120-1b includes a Qb node charging unit or circuitry and a Qb node discharging unit or circuitry.

The Qb node charging unit includes a plurality of transistors T4A and T4B. The Qb node discharging unit includes a plurality of transistors T5A and TSB, and the plurality of transistors T5A and TSB are connected in parallel.

The Qb node charging unit switches a current path between the second high potential voltage line GVDD1 and the Qb node Qb(n) according to a voltage of an (n-1)$^{th}$ Qb node Qb(n-1) from the (n-1)th signal transfer unit ST(n-1).

The 4a$^{th}$ transistor T4A is turned on when a voltage of a first node 80 is a high voltage equal to or greater than the gate-on voltage VEH and charges the Qb node Qb(n) to a high voltage equal to or greater than the gate-on voltage VEH by connecting the second high potential voltage line GVDD1 to the Qb node Qb(n). The 4a$^{th}$ transistor T4A includes a gate connected to the first node 80, a first electrode connected to the second high potential voltage line GVDD1, and a second electrode connected to the Qb node Qb(n). A first capacitor C1 is connected between the gate of the 4a$^{th}$ transistor T4A and the second electrode. When the 4a$^{th}$ transistor T4A is turned on by the first capacitor C1, the voltage of the first node 80 may be boosted.

The 4b$^{th}$ transistor T4B is turned on when the voltage of the (n-1)$^t$ Qb node Qb(n-1) of the (n-1)$^{th}$ signal transfer unit ST(n-1) is a high voltage equal to or greater than the gate-on voltage VEH and charges the first node 80 greater than the gate-on voltage VEH by supplying the second high potential voltage of the second high potential voltage line GVDD1 to the first node 80. The 4b$^{th}$ transistor T4B includes a gate connected to the (n-1)$^{th}$ Qb node Qb(n-1) of the (n-1)$^{th}$ signal transfer unit ST(n-1), a first electrode connected to the second high potential voltage line GVDD1, and a second electrode connected to the first node 80.

The Qb node discharging unit is turned on when the voltage of the Qh node Qh(n) is a high voltage equal to or greater than the gate-on voltage VEH and discharges the Qb node Qb(n).

The 5a$^{th}$ transistor T5A is turned on when the voltage of the Qh node Qh(n) is a high voltage equal to or greater than the gate-on voltage VEH and discharges the voltage of the Qb node Qb(n) to a third low potential voltage by connecting the Qb node Qb(n) to a third low potential voltage line GVSS2. The 5a$^{th}$ transistor T5A includes a gate connected to the Qh node Qh(n), a first electrode connected to the Qb node Qb(n), and a second electrode connected to a third low potential voltage line GVSS2.

The 5b$^{th}$ transistor T5B is turned on when the voltage of the Qh node Qh(n) is a high voltage equal to or greater than the gate-on voltage VEH and connects the first node 80 to the second low potential voltage line GVSS1. The 5b$^{th}$ transistor T5B includes a gate connected to the Qh node Qh(n), a first electrode connected to the first node 80, and a second electrode connected to the second low potential voltage line GVSS1.

The third circuit unit 120-1c may output the carry signal C(n) responding to potentials of the Q node Q(n) and the Qb node Qb(n). The third circuit unit 120-1c may include third buffer transistors T6cr and T7cr outputting the carry signal C(n). The third buffer transistors T6cr and T7cr may output the carry signal C(n) based on the second high potential voltage applied through the second high potential voltage line GVDD1 and the third low potential voltage applied through the third low potential voltage line GVSS2.

The first output unit 120-2 may output the first gate signal OUT(n) responding to the potentials of the Q node Q(n) and the Qb node Qb(n). The first output unit 120-2 may include first buffer transistors T6 and T7 outputting the first gate signal OUT(n).

The first buffer transistors T6 and T7 may be divided into (e.g., may include) a first pull-up transistor T6 that is turned on based on the potential of the Q node Q(n) and a first pull-down transistor T7 that is turned on based on the potential of the Qb node Qb(n). In the first pull-up transistor T6, a gate electrode is connected to the Q node Q(n), a first electrode is connected to a high potential voltage line GVDD0, and a second electrode is connected to a first output terminal 71. In the first pull-down transistor T7, a gate electrode is connected to the Qb node Qb(n), a first electrode is connected to the first output terminal 71, and a second electrode is connected to a first low potential voltage line GVSS0. The first buffer transistors T6 and T7 may output the first gate signal OUT(n) based on a high potential voltage applied through the high potential voltage line GVDD0 and a first low potential voltage applied through the first low potential voltage line GVSS0.

The second output unit 120-3 may output a second gate signal OUTB(n) in which the phase of the first gate signal is reversed. The second output unit 120-3 may include second buffer transistors T6b and T7b outputting the second gate signal OUTB(n).

The second buffer transistors T6b and T7b may be divided into (e.g., may include) a second pull-up transistor T6b that is turned on based on the potential of a previous Qb node Qb(n-i) and a second pull-down transistor T7b that is turned on based on the potential of a following Q node Q(n+j). In the second pull-up transistor T6b, a gate electrode is connected to the previous Qb node Qb(n-i), a first electrode is connected to the high potential voltage line GVDD0, and a second electrode is connected to a second output terminal 72. In the second pull-down transistor T7b, a gate electrode is connected to the following Q node Q(n+j), a first electrode is connected to the second output terminal 72, and a second electrode is connected to the first low potential voltage line GVSS0.

In this case, switch elements T8 and T9 for adjusting a pulse width of the second gate signal may be included between the second pull-down transistor T7b and the following Q node Q(n+j). The switch elements T8 and T9 may be divided into a first switch element T8 that is turned on based on a clock signal, and a second switch element T9 that is turned on based on the potential of the previous Qb node Qb(n-i). The first switch element T8 includes a gate electrode to which a clock signal is applied, a first electrode connected to the following Q node Q(n+j), and a second electrode connected to a third control node QA. The second switch element T9 includes a gate electrode connected to the previous Qb node Qb(n-i), a first electrode connected to the third control node QA, and a second electrode connected to the third low potential voltage line GVSS2.

Figure 4:
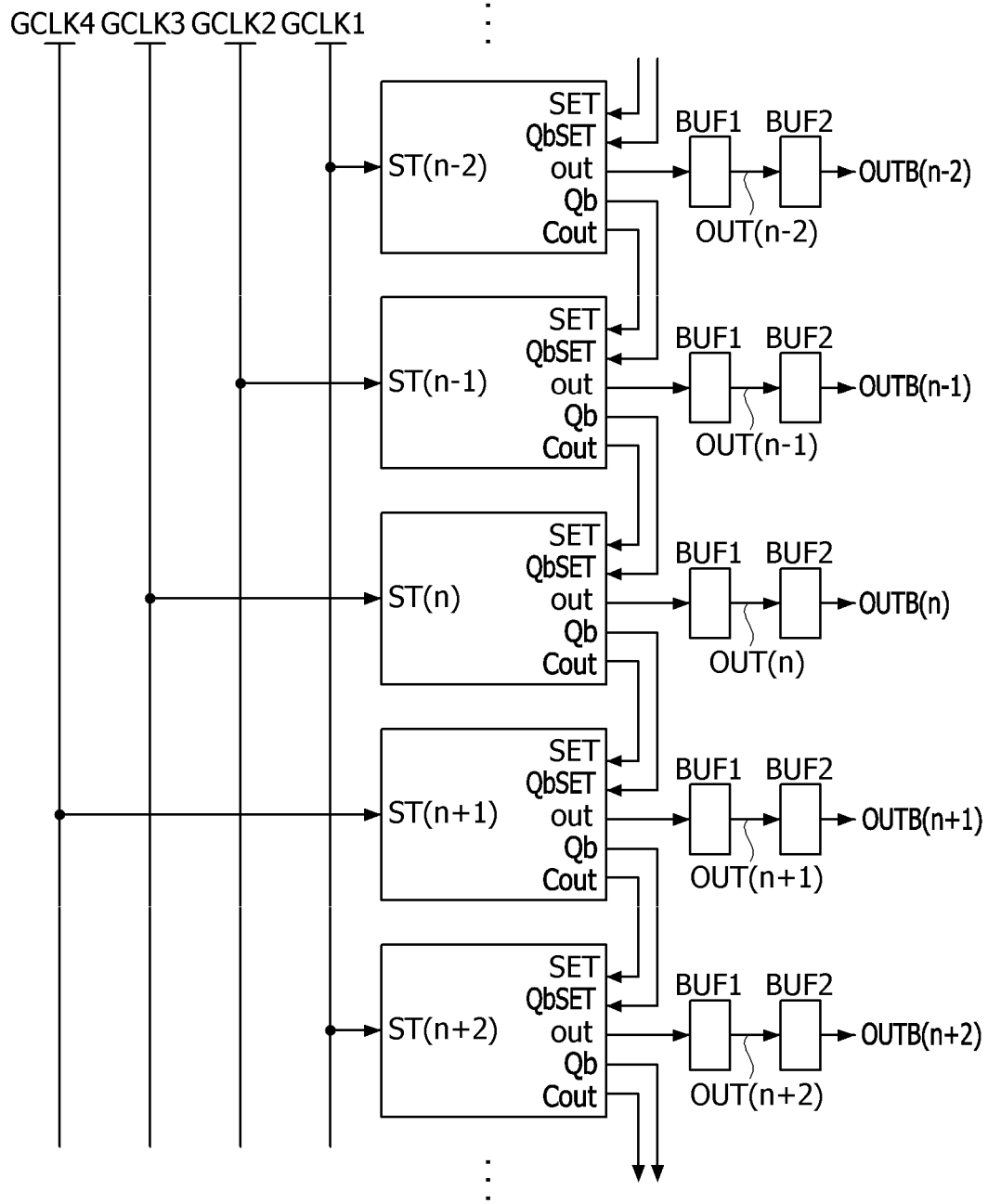
FIG. 4 is a view schematically illustrating a gate driver according to an embodiment of the present disclosure.

FIG. 4 is a view schematically illustrating a gate driver according to an embodiment of the present disclosure.

Referring to FIG. 4, the gate driver according to an embodiment includes a plurality of signal processing units ST(n-2), ST(n-1), ST(n), ST(n+1), and ST(n+2) cascade-connected via a carry line through which a carry signal is transmitted.

Each of the signal processing units ST(n-2), ST(n-1), ST(n), ST(n+1), and ST(n+2) receives a start pulse or carry signals C(n-2), C(n-1), C(n), C(n+1), and C(n+2) output from previous signal processing units, and receives a shift clock GCLK. A first signal processing unit ST(1) starts to be driven according to a start pulse Vst, and the other signal processing units ST(n-2), ST(n-1), ST(n), ST(n+1), and ST(n+2) start to be driven by receiving the carry signals C(n-2), C(n-1), C(n), C(n+1), and C(n+2) from the previous signal processing unit. The shift clock GCLK may be an N (N is a positive integer equal to or greater than 2) phase clock. For example, the shift clock GCLK may be a four-phase clock GCLK1, GCLK2, GCLK3, and GCLK4. The phases of the four-phase shift clocks GCLK1, GCLK2, GCLK3, and GCLK4 are opposite to each other. The signal processing units ST(n-2), ST(n-1), ST(n), ST(n+1), and ST(n+2) may sequentially output in-phase first gate signals OUT(n-2), OUT(n-1), OUT(n), OUT(n+1), and OUT(n+2) and reversed phase second gate signals OUTB(n-2), OUTB(n-1), OUTB(n), OUTB(n+1), and OUTB(n+2) by shifting the start pulse or the carry signals C(n-2), C(n-1), C(n), C(n+1), and C(n+2) from the previous signal processing units according to the timing of the shift clock. It should be understood that the carry signals C(n-2), C(n-1), C(n), C(n+1), and C(n+2) may be signals outputted on carry lines (designated by arrows) connected from terminals Cout to respective terminals SET, as shown in FIG. 4.

In this case, each of the signal processing units may output the in-phase first gate signals OUT(n-2), OUT(n-1), OUT(n), OUT(n+1), and OUT(n+2) by a first buffer BUF1, and the reversed phase second gate signals OUTB(n-2), OUTB(n-1), OUTB(n), OUTB(n+1), and OUTB(n+2) by a second buffer BUF2.

Figure 5:
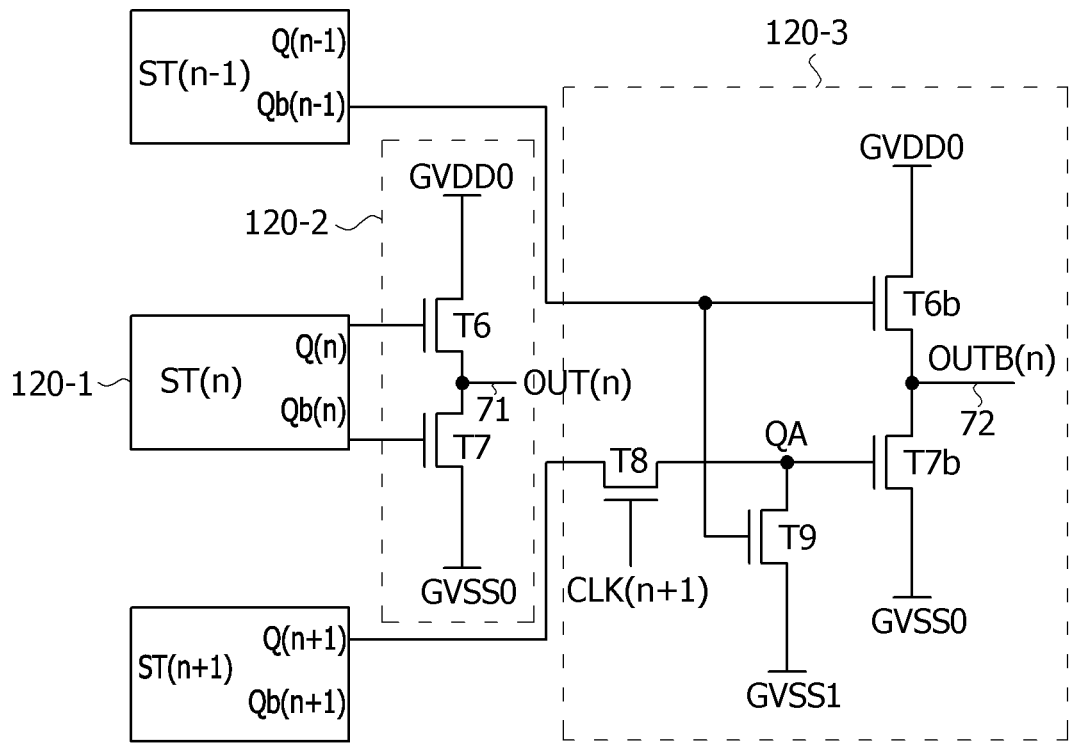
FIG. 5 is a view illustrating a gate driver according to a second embodiment of the present disclosure.
Figure 6:
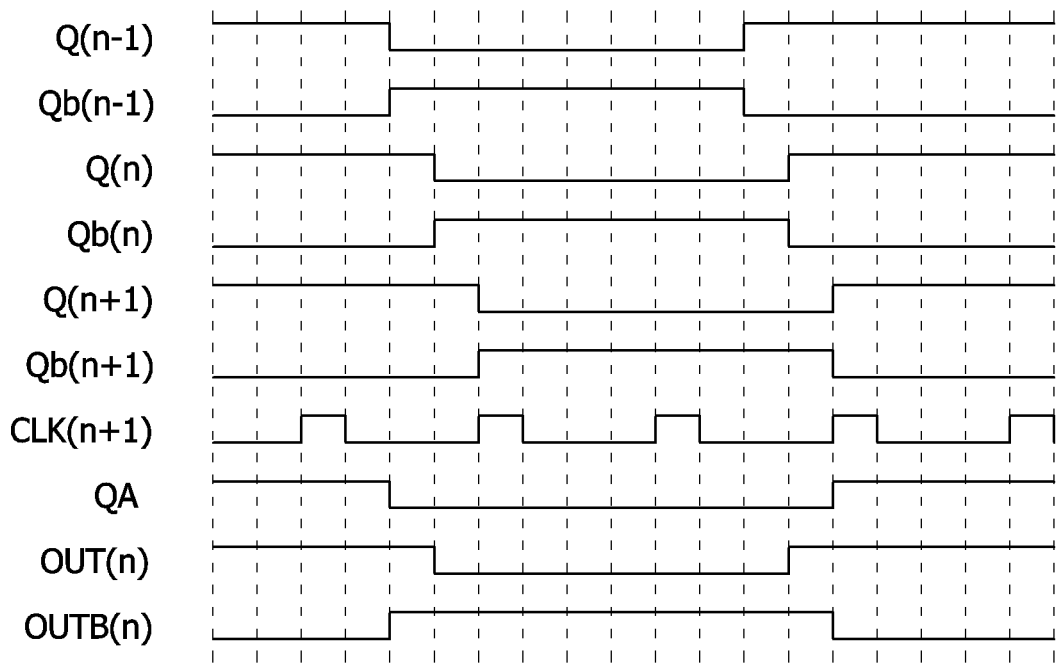
FIG. 6 is a waveform diagram illustrating input/output signals and voltages of control nodes of the gate driver shown in FIG. 5.

FIG. 5 is a view illustrating a gate driver according to a second embodiment of the present disclosure, and FIG. 6 is a waveform diagram illustrating input/output signals and voltages of control nodes of the gate driver shown in FIG. 5.

Referring to FIGS. 5 and 6, the gate driver according to the second embodiment of the present disclosure may include a plurality of signal transfer units, and each of the signal transfer units may include a circuit unit 120-1, a first output unit 120-2, and a second output unit 120-3.

The circuit unit 120-1 may charge and discharge a Q node Q(n) and a Qb node Qb(n), and output a carry signal C(n) according to potentials of the Q node Q(n) and the Qb node Qb(n).

The first output unit 120-2 may output a first gate signal OUT(n) responding to the potentials of the Q node Q(n) and the Qb node Qb(n) of an $n^{th}$ (n is a positive integer) signal transfer unit ST(n). The first output unit 120-2 may include first buffer transistors T6 and T7 outputting the first gate signal OUT(n).

The first buffer transistors T6 and T7 may be divided into a first pull-up transistor T6 that is turned on based on the potential of the Q node Q(n), and a first pull-down transistor T7 that is turned on based on the potential of the Qb node Qb(n). In the first pull-up transistor T6, a gate electrode is connected to the Q node Q(n), a first electrode is connected to a high potential voltage line GVDD0, and a second electrode is connected to a first output terminal 71. In the first pull-down transistor T7, a gate electrode is connected to the Qb node Qb(n), a first electrode is connected to the first output terminal 71, and a second electrode is connected to a first low potential voltage line GVSS0. The first buffer transistors T6 and T7 may output the first gate signal OUT(n) based on a high potential voltage applied through the high potential voltage line GVDD0 and a first low potential voltage applied through the first low potential voltage line GVSS0.

Figure 8:
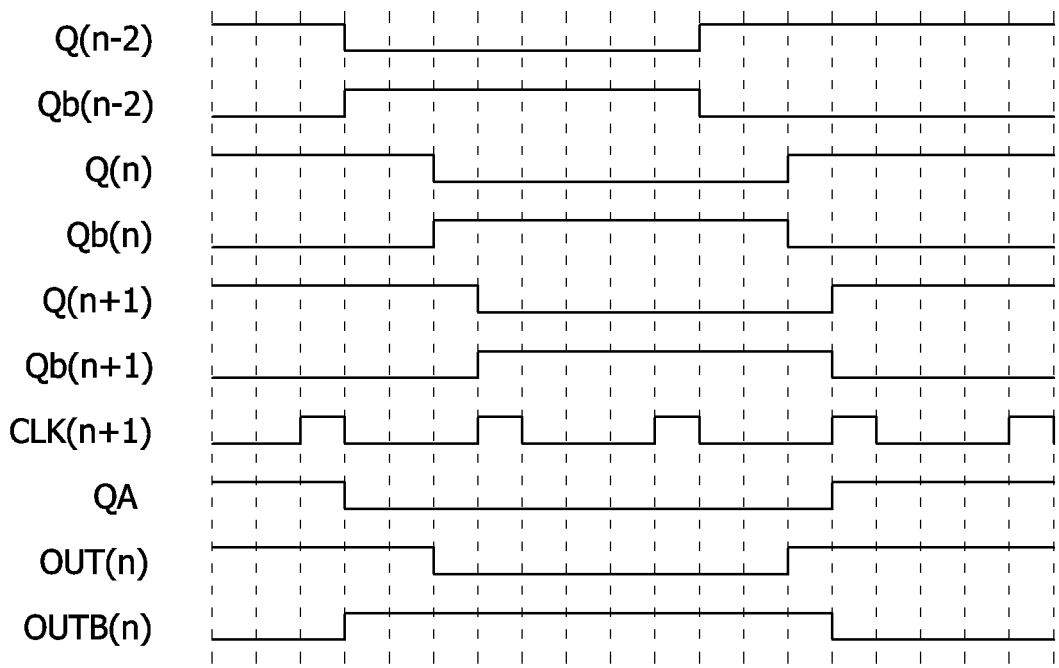
FIG. 8 is a waveform diagram illustrating input/output signals and voltages of control nodes of the gate driver shown in FIG. 7.

The second output unit 120-3 may output a second gate signal OUTB(n) in which the phase of the first gate signal is reversed responding to the potentials of a Qb node Qb(n-1) of an $(n-1)^{th}$ signal transfer unit ST(n-1) and a Q node Q(n+1) of an $(n+1)^{th}$ signal transfer unit ST(n+1). The second output unit 120-3 may include second buffer transistors T6b and T7b outputting the second gate signal OUTB(n). It should be understood that "phase" of a signal "is reversed" includes the meaning of having opposite polarity of the signal in most (e.g., all but a few) horizontal periods. For example, as shown in FIG. 6, the first gate signal OUT(n) and the second gate signal OUTB(n) have opposite polarity in almost all horizontal periods. In FIG. 6, the second gate signal OUTB(n) having phase that is the reverse of the first gate signal OUT(n) has pulse width that is two horizontal periods (2H) wider than pulse width of the first gate signal OUT(n). In FIG. 8, the second gate signal OUTB(n) having phase that is the reverse of the first gate signal OUT(n) has pulse width that is three horizontal periods (3H) wider than pulse width of the first gate signal OUT(n).

The second buffer transistors T6b and T7b may be divided into a second pull-up transistor T6b that is turned on based on the potential of the previous Qb node Qb(n-1), and a second pull-down transistor T7b that is turned on based on the potential of the following Q node Q(n+1). In the second pull-up transistor T6b, a gate electrode is connected to the previous Qb node Qb(n-1), a first electrode is connected to the high potential voltage line GVDD0, and a second electrode is connected to a second output terminal 72. In the second pull-down transistor T7b, a gate electrode is connected to the following Q node Q(n+1), a first electrode is connected to the second output terminal 72, and a second electrode is connected to the first low potential voltage line GVSS0.

In this case, switch elements T8 and T9 for adjusting a pulse width of the second gate signal may be included between the second pull-down transistor T7b and the following Q node Q(n+1). The switch elements T8 and T9 may be divided into a first switch element T8 that is turned on based on a clock signal, and a second switch element T9 that is turned on based on the previous Qb node Qb(n-1). The first switch element T8 includes a gate electrode to which a clock signal is applied, a first electrode connected to a following Q node Q(n+j), and a second electrode connected to a third control node QA. The second switch element T9 includes a gate electrode connected to a previous Qb node Qb(n-i), a first electrode connected to the third control node QA, and a second electrode connected to a second low potential voltage line GVSS1.

In this case, the pulse width of the high voltage of the second gate signal may be formed to be larger than the pulse width of the first gate signal, and may be formed to be two horizontal periods (2H) longer than a section in which the pulse of the low voltage of the first gate signal is applied as shown in FIG. 6. Here, the section to which the pulse of the high voltage of the second gate signal is applied may be formed to be 1H longer based on a falling edge of the section to which the pulse of the low voltage of the first gate signal is applied, and may be formed to be 1H longer based on a rising edge. It should be understood that "1H" and "2H" (or "3H" in other contexts) includes the meaning of a number of partial cycles of a clock signal. For example, as shown in FIG. 6, a main clock CLK(n+1) may include four horizontal periods (4H), with a duty cycle of one horizontal period (1H). Each one horizontal period (1H) may be represented by distance between adjacent dashed lines in FIG. 6. As such, the second gate signal OUTB(n) has a rising edge that leads a falling edge of the first gate signal OUT(n) by one horizontal period (1H), and a subsequent falling edge that leads a rising edge of the first gate signal OUT(n) by one horizontal period (1H). In this example, the pulse width of the high voltage of the second gate signal OUTB(n) is two horizontal periods (2H) longer (or wider) than the pulse width of the low voltage of the first gate signal OUT(n).

Figure 7:
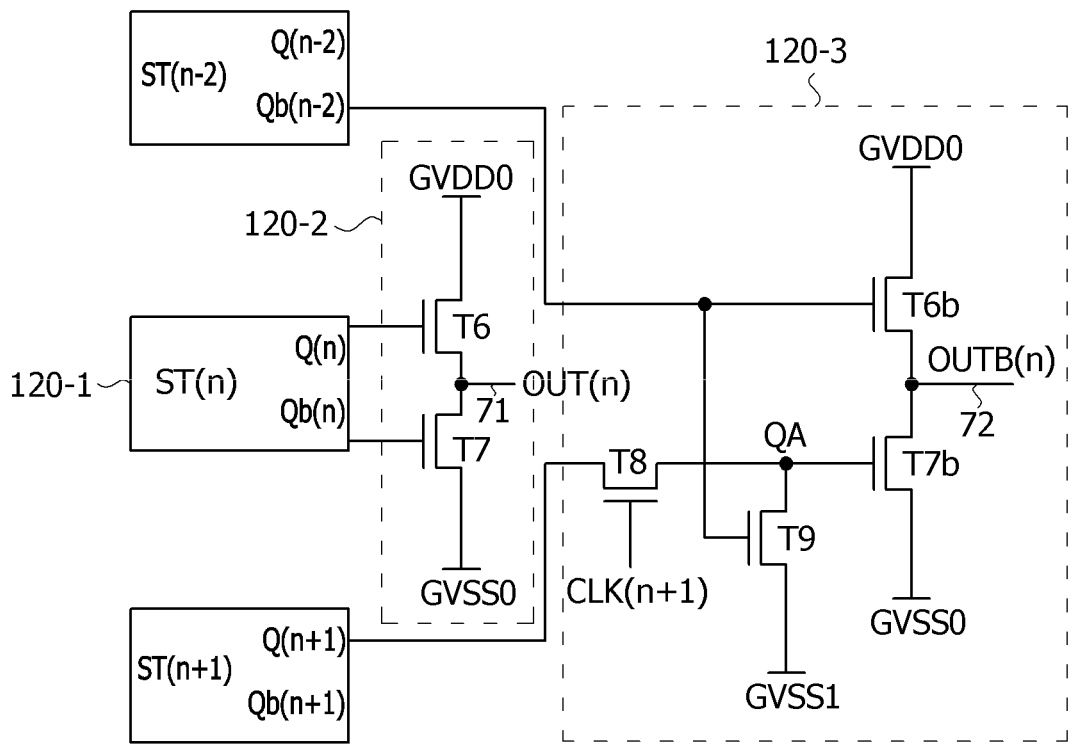
FIG. 7 is a view illustrating a gate driver according to a third embodiment of the present disclosure.

FIG. 7 is a view illustrating a gate driver according to a third embodiment of the present disclosure, and FIG. 8 is a waveform diagram illustrating input/output signals and voltages of control nodes of the gate driver shown in FIG. 7.

Referring to FIGS. 7 and 8, the gate driver according to the third embodiment of the present disclosure may include a plurality of signal transfer units, and each of the signal transfer units may include a circuit unit 120-1, a first output unit 120-2, and a second output unit 120-3.

The circuit unit 120-1 may charge and discharge a Q node Q(n) and a Qb node Qb(n), and output a carry signal C(n) according to potentials of the Q node Q(n) and the Qb node Qb(n).

The first output unit 120-2 may output a first gate signal OUT(n) responding to the potentials of the Q node Q(n) and the Qb node Qb(n) of an $n^{th}$ signal transfer unit. The first output unit 120-2 may include first buffer transistors T6 and T7 outputting the first gate signal OUT(n).

The first buffer transistors T6 and T7 may be divided into a first pull-up transistor T6 that is turned on based on the potential of the Q node Q(n) and a first pull-down transistor T7 that is turned on based on the potential of the Qb node Qb(n). In the first pull-up transistor T6, a gate electrode is connected to the Q node Q(n), a first electrode is connected to a high potential voltage line GVDD0, and a second electrode is connected to a first output terminal 71. In the first pull-down transistor T7, a gate electrode is connected to the Qb node Qb(n), a first electrode is connected to the first output terminal 71, and a second electrode is connected to a first low potential voltage line GVSS0. The first buffer transistors T6 and T7 may output the first gate signal OUT(n) based on a high potential voltage applied through the high potential voltage line GVDD0 and a first low potential voltage applied through the first low potential voltage line GVSS0.

The second output unit 120-3 may output the second gate signal OUTB(n) in which the phase of the first gate signal is reversed responding to the potentials of a Qb node Qb(n-2) of an $(n-2)^{th}$ signal transfer unit and a Q node Q(n+1) of an $(n+1)^{th}$ signal transfer unit. The second output unit 120-3 may include second buffer transistors T6b and T7b outputting the second gate signal OUTB(n).

The second buffer transistors T6b and T7b may be divided into a second pull-up transistor T6b that is turned on based on the potential of the previous Qb node Qb(n-2), and a second pull-down transistor T7b that is turned on based on the potential of the following Q node Q(n+1). In the second pull-up transistor T6b, a gate electrode is connected to the previous Qb node Qb(n-2), a first electrode is connected to the high potential voltage line GVDD0, and a second electrode is connected to the second output terminal 72. In the second pull-down transistor T7b, a gate electrode is connected to the following Q node Q(n+1), a first electrode is connected to the second output terminal 72, and a second electrode is connected to the first low potential voltage line GVSS0.

In this case, switch elements T8 and T9 for adjusting a pulse width of the second gate signal may be included between the second pull-down transistor T7b and the following Q node Q (n+1). The switch elements T8 and T9 may be divided into a first switch element T8 that is turned on based on a clock signal, and a second switch element T9 that is turned on based on the potential of the previous Qb node Qb(n-2). The first switch element T8 includes a gate electrode to which a clock signal is applied, a first electrode connected to the following Q node Q(n+j), and a second electrode connected to a third control node QA. The second switch element T9 includes a gate electrode connected to the previous Qb node Qb(n-i), a first electrode connected to the third control node QA, and a second electrode connected to a second low potential voltage line GVSS1.

In this case, the pulse width of the high voltage of the second gate signal may be formed to be larger than the pulse width of the first gate signal, and may be formed to be 3H longer than a section in which the pulse of the low voltage of the first gate signal is applied as shown in FIG. 8. Here, the section to which the pulse of the high voltage of the second gate signal is applied may be formed to be 2H longer based on a falling edge of the section to which the pulse of the low voltage of the first gate signal is applied, and may be formed to be 1H longer based on a rising edge.

Figure 9:
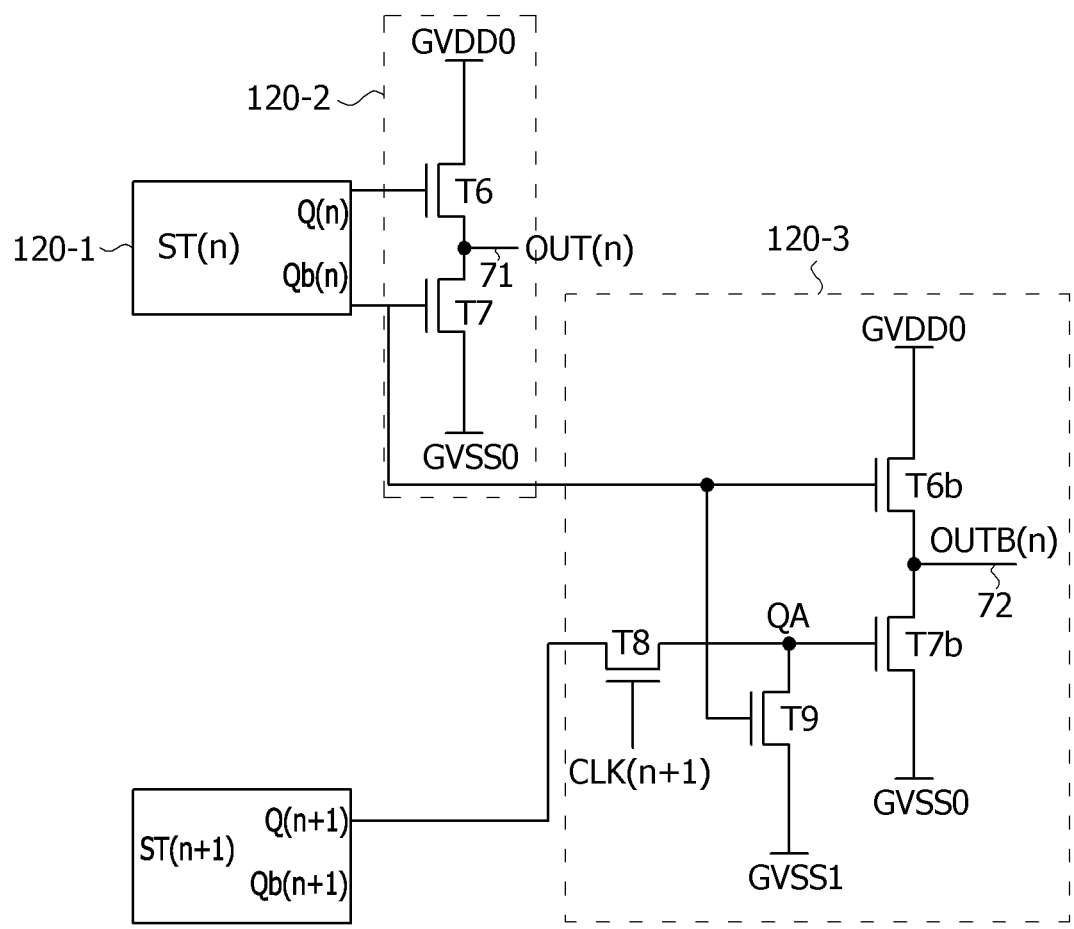
FIG. 9 is a view illustrating a gate driver according to a fourth embodiment of the present disclosure.
Figure 10:
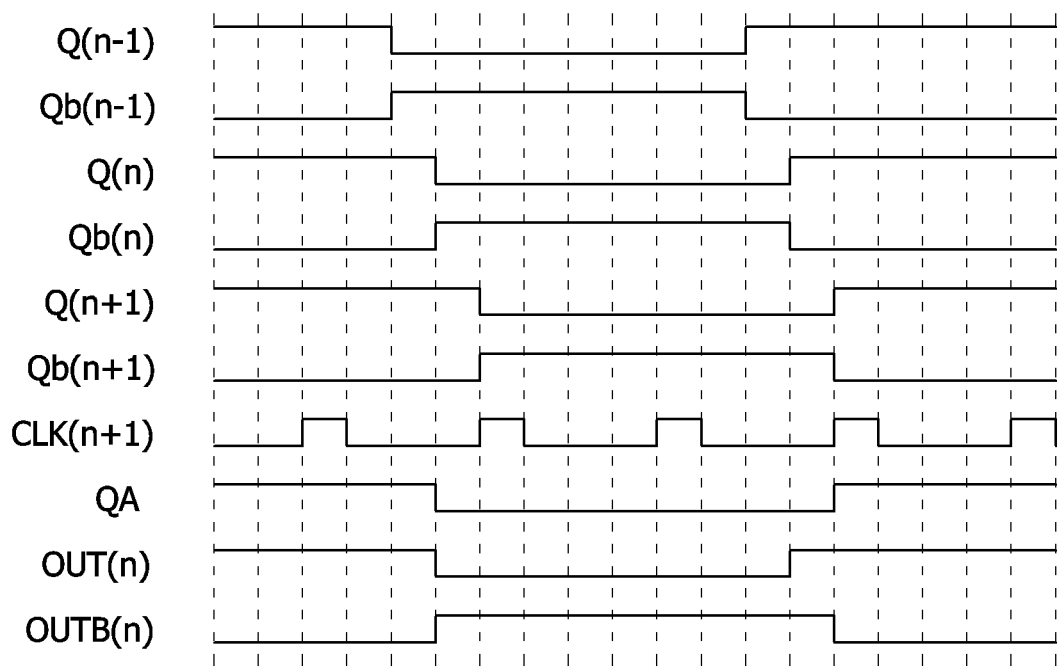
FIG. 10 is a waveform diagram illustrating input/output signals and voltages of control nodes of the gate driver shown in FIG. 9.

FIG. 9 is a view illustrating a gate driver according to a fourth embodiment of the present disclosure, and FIG. 10 is a waveform diagram illustrating input/output signals and voltages of control nodes of the gate driver shown in FIG. 9.

Referring to FIGS. 9 and 10, the gate driver according to the fourth embodiment of the present disclosure may include a plurality of signal transfer units, and each of the signal transfer units may include a circuit unit 120-1, a first output unit 120-2, and a second output unit 120-3.

The circuit unit 120-1 may charge and discharge a Q node Q(n) and a Qb node Qb(n), and output a carry signal C(n) according to potentials of the Q node Q(n) and the Qb node Qb(n).

The first output unit 120-2 may output a first gate signal OUT(n) responding to the potentials of the Q node Q(n) and the Qb node Qb(n) of an $n^{th}$ signal transfer unit. The first output unit 120-2 may include first buffer transistors T6 and T7 outputting the first gate signal OUT(n).

The first buffer transistors T6 and T7 may be divided into a first pull-up transistor T6 that is turned on based on the potential of the Q node Q(n) and a first pull-down transistor T7 that is turned on based on the potential of the Qb node Qb(n). In the first pull-up transistor T6, a gate electrode is connected to the Q node Q(n), a first electrode is connected to a high potential voltage line GVDD0, and a second electrode is connected to a first output terminal 71. In the first pull-down transistor T7, a gate electrode is connected to the Qb node Qb(n), a first electrode is connected to the first output terminal 71, and a second electrode is connected to a first low potential voltage line GVSS0. The first buffer transistors T6 and T7 may output the first gate signal OUT(n) based on a high potential voltage applied through the high potential voltage line GVDD0 and a first low potential voltage applied through the first low potential voltage line GVSS0.

The second output unit 120-3 may output a second gate signal OUTB(n) in which the phase of the first gate signal is reversed responding to the potentials of the Qb node Qb(n) of the $n^{th}$ signal transfer unit and a Q node Q(n+1) of an $(n+1)^{th}$ signal transfer unit. The second output unit 120-3 may include second buffer transistors T6b and T7b outputting the second gate signal OUTB(n).

The second buffer transistors T6b and T7b may be divided into a second pull-up transistor T6b that is turned on based on the potential of the Qb node Qb(n), and a second pull-down transistor T7b that is turned on based on the potential of the following Q node Q(n+1). In the second pull-up transistor T6b, a gate electrode is connected to the Qb node Qb(n), a first electrode is connected to the high potential voltage line GVDD0, and a second electrode is connected to the second output terminal 72. In the second pull-down transistor T7b, a gate electrode is connected to the following Q node Q(n+1), a first electrode is connected to the second output terminal 72, and a second electrode is connected to the first low potential voltage line GVSS0.

In this case, switch elements T8 and T9 for adjusting a pulse width of the second gate signal may be included between the second pull-down transistor T7b and the following Q node Q(n+1). The switch elements T8 and T9 may be divided into a first switch element T8 turned on based on a clock signal, and a second switch element T9 turned on based on the Qb node Qb(n). The first switch element T8 includes a gate electrode to which a clock signal is applied, a first electrode connected to the following Q node Q(n+1), and a second electrode connected to a third control node QA. The second switch element T9 includes a gate electrode connected to the Qb node Qb(n), a first electrode connected to the third control node QA, and a second electrode connected to a second low potential voltage line GVSS1.

In this case, the pulse width of the high voltage of the second gate signal may be formed to be larger than the pulse width of the first gate signal, and may be formed to be 1H longer than a section in which the pulse of the low voltage of the first gate signal is applied as shown in FIG. 10. Here, the section to which the pulse of the high voltage of the second gate signal is applied may be formed to be 1H longer based on a rising edge of the section to which the pulse of the low voltage of the first gate signal is applied.

In an embodiment, a second gate signal in which the phase of a first gate signal is reversed may be output. The second gate signal may be formed according to voltages of a second node of an $(n-i)^{th}$ (i is a positive integer less than n) signal transfer unit and a first node of an $(n+j)^{th}$ (j is a positive integer greater than n) signal transfer unit. In this case, the section in which the pulse of the high voltage of the second gate signal is applied may be formed to be 1H or more longer than the section in which the pulse of the low voltage of the first gate signal is applied. In addition, the section to which the pulse of the high voltage of the second gate signal is applied may be formed to be 1H or more longer based on at least one edge of the rising edge and the falling edge of the section to which the pulse of the low voltage of the first gate signal is applied.

Figure 11:
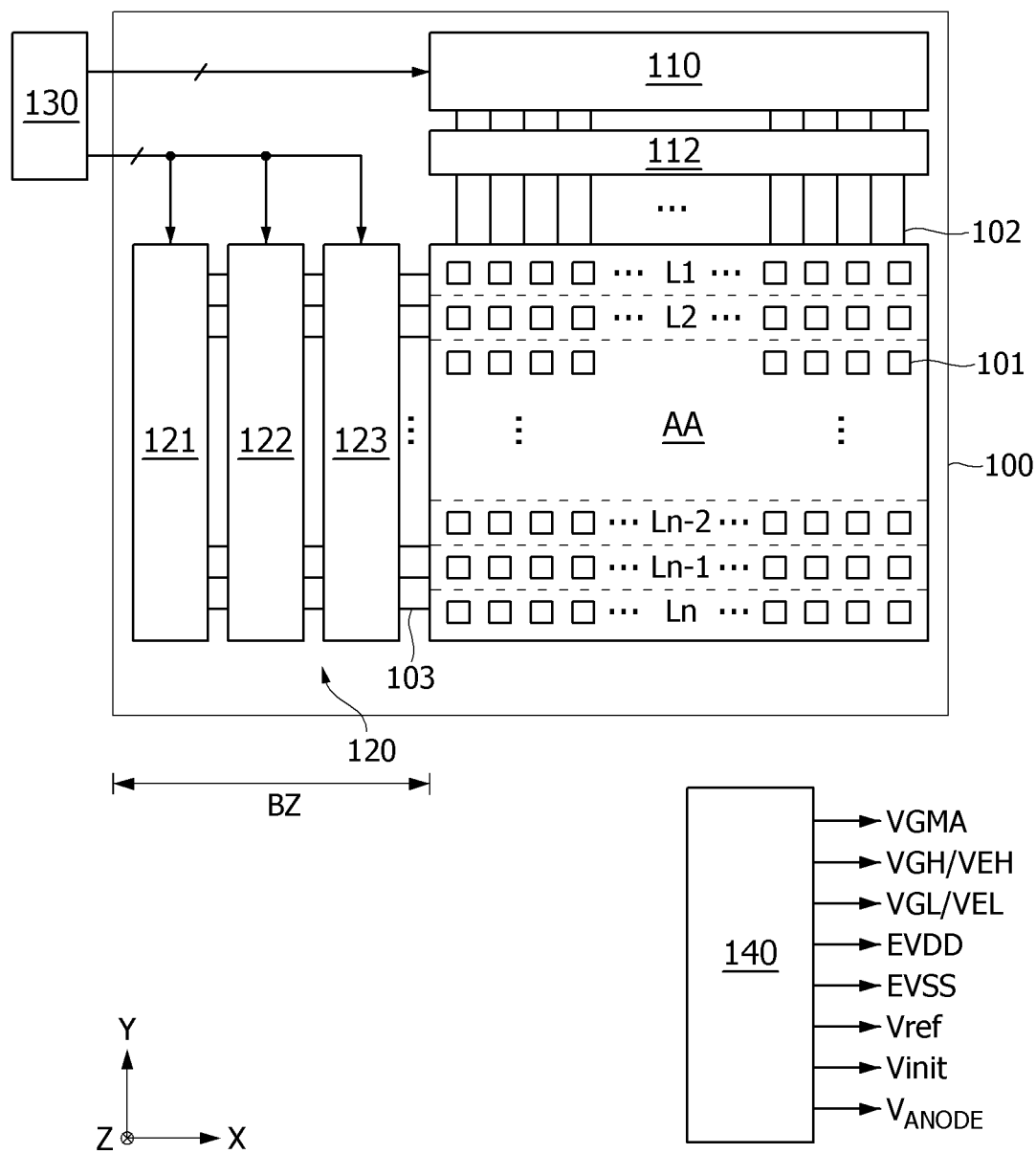
FIG. 11 is a block diagram illustrating a display device according to an embodiment of the present disclosure.
Figure 12:
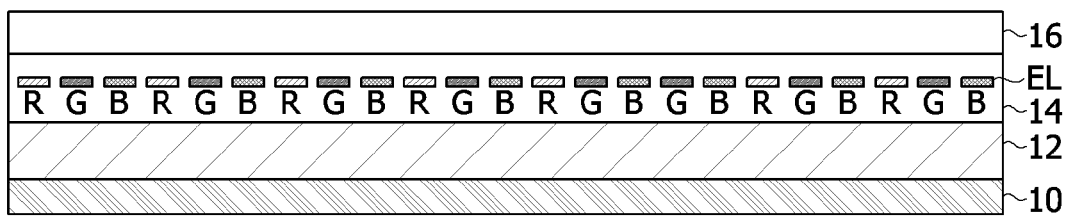
FIG. 12 is a diagram illustrating a cross-sectional structure of the display panel shown in FIG. 11.
Figure 12:
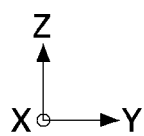
Figure 13:
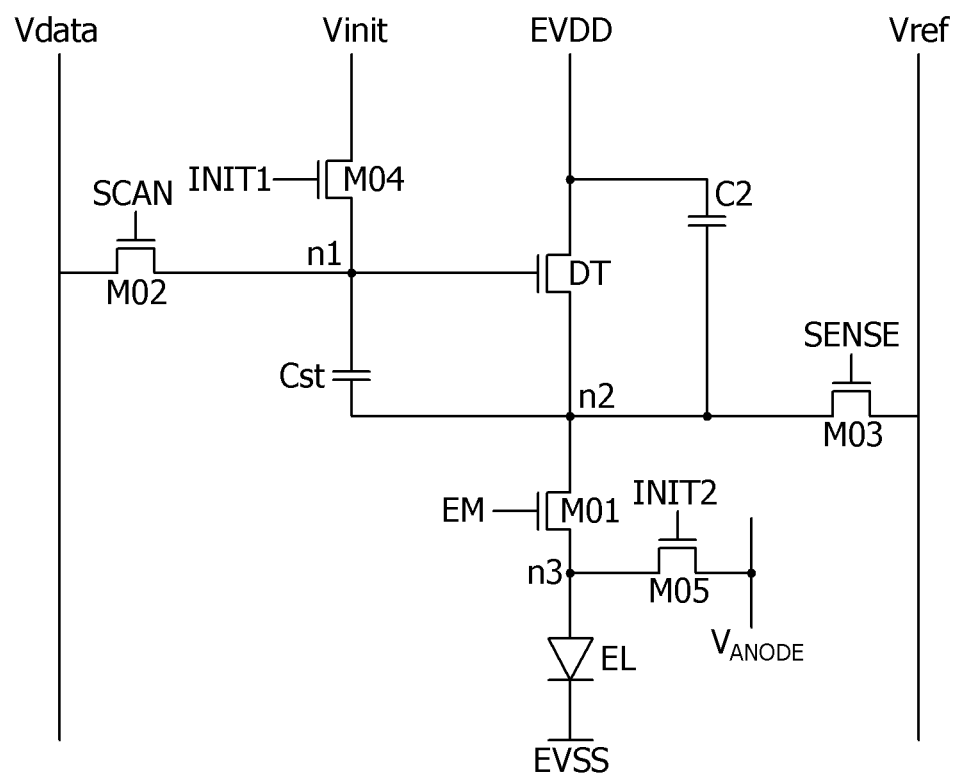
FIG. 13 is a view illustrating a pixel circuit applied to a display panel shown in FIG. 11.
Figure 14:
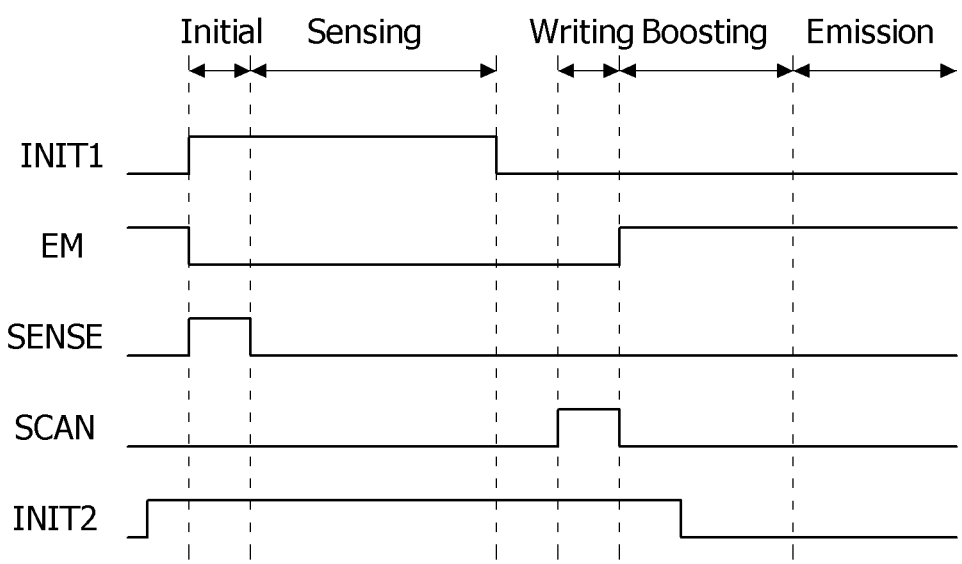
FIG. 14 is a waveform diagram illustrating input/output signals and voltages of control nodes of the gate driver shown in FIG. 13.

FIG. 11 is a block diagram illustrating a display device according to an embodiment of the present disclosure, and FIG. 12 is a diagram illustrating a cross-sectional structure of the display panel shown in FIG. 11, FIG. 13 is a view illustrating a pixel circuit applied to a display panel shown in FIG. 11, and FIG. 14 is a waveform diagram illustrating input/output signals and voltages of control nodes of the gate driver shown in FIG. 13.

Referring to FIG. 11, the display device according to an embodiment of the present disclosure includes a display panel 100, a display panel driver for writing pixel data to pixels of the display panel 100, and a power supply 140 for generating power beneficial for driving the pixels and the display panel driver.

The display panel 100 includes a pixel array AA that displays an input image. The pixel array AA includes a plurality of data lines 102, a plurality of gate lines 103 intersected with the data lines 102, and pixels arranged in a matrix form.

The pixel array AA includes a plurality of pixel lines L1 to Ln. Each of the pixel lines L1 to Ln includes one line of pixels arranged along a line direction X in the pixel array AA of the display panel 100. Pixels arranged in one pixel line share the gate lines 103. Sub-pixels arranged in a column direction Y along a data line direction share the same data line 102. One horizontal period 1H is a time obtained by dividing one frame period by the total number of pixel lines L1 to Ln.

Touch sensors may be disposed on the display panel 100. A touch input may be sensed using separate touch sensors or may be sensed through pixels. The touch sensors may be disposed as an on-cell type or an add-on type on the screen of the display panel or implemented as in-cell type touch sensors embedded in the pixel array AA.

The display panel 100 may be implemented as a flexible display panel. The flexible display panel may be made of a plastic OLED panel. An organic thin film may be disposed on a back plate of the plastic OLED panel, and the pixel array AA may be formed on the organic thin film.

The back plate of the plastic OLED may be a polyethylene terephthalate (PET) substrate. The organic thin film is formed on the back plate. The pixel array AA and a touch sensor array may be formed on the organic thin film. The back plate blocks moisture permeation so that the pixel array AA is not exposed to humidity. The organic thin film may be a thin Polyimide (PI) film substrate. A multi-layered buffer film may be formed of an insulating material (not shown) on the organic thin film. Lines may be formed on the organic thin film so as to supply power or signals applied to the pixel array AA and the touch sensor array.

To implement color, each of the pixels may be divided into a red sub-pixel (hereinafter referred to as "R sub-pixel"), a green sub-pixel (hereinafter referred to as "G sub-pixel"), and a blue sub-pixel (hereinafter referred to as "B sub-pixel"). Each of the pixels may further include a white sub-pixel. Each of the sub-pixels 101 includes a pixel circuit. The pixel circuit is connected to the data line 102 and the gate line 103.

Hereinafter, a pixel may be interpreted as having the same meaning as a sub-pixel.

As shown in FIG. 12, when viewed from a cross-sectional structure, the display panel 100 may include a circuit layer 12, a light emitting element layer 14, and an encapsulation layer 16 stacked on a substrate 10.

The circuit layer 12 may include a pixel circuit connected to wirings such as a data line, a gate line, and a power line, a gate driver (GIP) connected to the gate lines, a de-multiplexer array 112, a circuit (not shown) for auto probe inspection, and the like. The wirings and circuit elements of the circuit layer 12 may include a plurality of insulating layers, two or more metal layers separated with the insulating layer therebetween, and an active layer including a semiconductor material. All transistors formed in the circuit layer 12 may be implemented as oxide TFTs having an n-channel type oxide semiconductor.

The light emitting element layer 14 may include a light emitting element EL driven by a pixel circuit. The light emitting element EL may include a red (R) light emitting element, a green (G) light emitting element, and a blue (B) light emitting element. The light emitting element layer 14 may include a white light emitting element and a color filter. The light emitting elements EL of the light emitting element layer 14 may be covered by a protective layer including an organic film and a passivation film.

The encapsulation layer 16 covers the light emitting element layer 14 to seal the circuit layer 12 and the light emitting element layer 14. The encapsulation layer 16 may have a multilayered insulating structure in which an organic film and an inorganic film are alternately stacked. The inorganic film blocks the penetration of moisture and oxygen. The organic film planarizes the surface of the inorganic film. When the organic film and the inorganic film are stacked in multiple layers, a movement path of moisture or oxygen becomes longer compared to a single layer, so that penetration of moisture and oxygen affecting the light emitting element layer 14 can be effectively blocked.

A touch sensor layer may be disposed on the encapsulation layer 16. The touch sensor layer may include capacitive type touch sensors that sense a touch input based on a change in capacitance before and after the touch input. The touch sensor layer may include metal wiring patterns and insulating layers forming the capacitance of the touch sensors. The capacitance of the touch sensor may be formed between the metal wiring patterns. A polarizing plate may be disposed on the touch sensor layer. The polarizing plate may improve visibility and contrast ratio by converting the polarization of external light reflected by metal of the touch sensor layer and the circuit layer 12. The polarizing plate may be implemented as a polarizing plate in which a linear polarizing plate and a phase delay film are bonded, or a circular polarizing plate. A cover glass may be adhered to the polarizing plate.

The display panel 100 may further include a touch sensor layer and a color filter layer stacked on the encapsulation layer 16. The color filter layer may include red, green, and blue color filters and a black matrix pattern. The color filter layer may replace the polarizing plate and increase the color purity by absorbing a part of the wavelength of light reflected from the circuit layer and the touch sensor layer. In this embodiment, by applying the color filter layer 20 having a higher light transmittance than the polarizing plate to the display panel, the light transmittance of the display panel PNL can be improved, and the thickness and flexibility of the display panel PNL can be improved. A cover glass may be adhered on the color filter layer.

The power supply 140 generates DC power beneficial for driving the pixel array AA and the display panel driving circuit of the display panel 100 by using a DC-DC converter. The DC-DC converter may include a charge pump, a regulator, a buck converter, a boost converter, and the like. The power supply 140 may adjust a DC input voltage from a host system (not shown) and thereby generate DC voltages such as a gamma reference voltage VGMA, gate-on voltages VGH and VEH, gate-off voltages VGL and VEL, a pixel driving voltage EVDD, and a pixel low-potential power supply voltage EVSS. The gamma reference voltage VGMA is supplied to a data driver 110. The gate-on voltages VGH and VEH and the gate-off voltages VGL and VEL are supplied to a gate driver 120. The pixel driving voltage EVDD and the pixel low-potential power supply voltage EVSS are commonly supplied to the pixels.

The display panel driving circuit writes pixel data (digital data) of an input image to the pixels of the display panel 100 under the control of a timing controller (TCON) 130.

The display panel driving circuit includes the data driver 110 and the gate driver 120.

A de-multiplexer (DEMUX) 112 may be disposed between the data driver 110 and the data lines 102. The de-multiplexer 112 sequentially connects one channel of the data driver 110 to the plurality of data lines 102 and distributes in a time division manner the data voltage outputted from one channel of the data driver 110 to the data lines 102, thereby reducing the number of channels of the data driver 110. The de-multiplexer array 112 may be omitted. In this case, output buffers AMP of the data driver 110 are directly connected to the data lines 102.

The display panel driving circuit may further include a touch sensor driver for driving the touch sensors. The touch sensor driver is omitted from FIG. 11. In a mobile device, the timing controller 130, the power supply 140, the data driver 110, and the like may be integrated into one drive integrated circuit (IC).

The data driver 110 generates a data voltage Vdata by converting pixel data of an input image received from the timing controller 130 with a gamma compensation voltage every frame period by using a digital to analog converter (DAC). The gamma reference voltage VGMA is divided for respective gray scales through a voltage divider circuit. The gamma compensation voltage divided from the gamma reference voltage VGMA is provided to the DAC of the data driver 110. The data voltage Vdata is outputted through the output buffer AMP in each of the channels of the data driver 110.

In the data driver 110, the output buffer AMP included in one channel may be connected to adjacent data lines 102 through the de-multiplexer array 112. The de-multiplexer array 112 may be formed directly on the substrate of the display panel 100 or integrated into one drive IC together with the data driver 110.

The gate driver 120 may be implemented as a gate in panel (GIP) circuit formed directly on a bezel BZ area of the display panel 100 together with the TFT array of the pixel array AA. The gate driver 120 sequentially outputs gate signals to the gate lines 103 under the control of the timing controller 130. The gate driver 120 may sequentially supply the gate signals to the gate lines 103 by shifting the gate signals using a shift register.

The gate signal may include a scan signal for selecting pixels of a line in which data is to be written in synchronization with the data voltage, and an EM signal defining (e.g., having pulse width equal to) an emission time of pixels charged with the data voltage.

The gate driver 120 may include a scan driver 121, an EM driver 122, and an initialization driver 123.

The scan driver 121 outputs a scan signal SCAN in response to a start pulse and a shift clock from the timing controller 130, and shifts the scan signal SCAN according to the shift clock timing. The EM driver 122 outputs an EM signal EM in response to a start pulse and a shift clock from the timing controller 130, and sequentially shifts the EM signal EM according to the shift clock. The initialization driver 123 outputs an initialization signal INIT in response to a start pulse and a shift clock from the timing controller 130, and shifts the initialization signal INIT according to the shift clock timing. Therefore, the scan signal SCAN, the EM signal EM, and the initialization signal INIT are sequentially supplied to the gate lines 103 of the pixel lines L1 to Ln. In case of a bezel-free model, at least some of transistors constituting the gate driver 120 and clock wirings may be dispersedly disposed in the pixel array AA.

The timing controller 130 receives, from a host system (not shown), digital video data of an input image and a timing signal synchronized therewith. The timing signal includes a vertical synchronization signal Vsync, a horizontal synchronization signal Hsync, a main clock CLK, a data enable signal DE, and the like. Because a vertical period and a horizontal period can be known by counting the data enable signal DE, the vertical synchronization signal Vsync and the horizontal synchronization signal Hsync may be omitted. The data enable signal DE has a cycle of one horizontal period (1H).

The host system may be any one of a television (TV) system, a set-top box, a navigation system, a personal computer (PC), a home theater system, a vehicle system, and a mobile device system.

The timing controller 130 multiplies an input frame frequency by i and controls the operation timing of the display panel driving circuit with a frame frequency of the input frame frequency×i (i is a positive integer greater than 0) Hz. The input frame frequency is 60 Hz in the NTSC (National Television Standards Committee) scheme and 50 Hz in the PAL (Phase-Alternating Line) scheme.

Based on the timing signals Vsync, Hsync, and DE received from the host system, the timing controller 130 generates a data timing control signal for controlling the operation timing of the data driver 110, MUX signals MUX1 and MUX2 for controlling the operation timing of the de-multiplexer array 112, and a gate timing control signal for controlling the operation timing of the gate driver 120.

The voltage level of the gate timing control signal outputted from the timing controller 130 may be converted into the gate-on voltages VGH and VEH and the gate-off voltages VGL and VEL through a level shifter (not shown) and then supplied to the gate driver 120. That is, the level shifter converts a low level voltage of the gate timing control signal into the gate-off voltages VGL and VEL and converts a high level voltage of the gate timing control signal into the gate-on voltages VGH and VEH. The gate timing signal includes the start pulse and the shift clock.

Referring to FIGS. 13 and 14, the pixel circuit according to an embodiment of the present disclosure includes a light emitting element EL, a driving element DT for supplying current to the light emitting element EL, a plurality of switch elements such as M01, M02, M03, M04, and M05 for switching a current path connected to the driving element DT, a first capacitor Cst for storing a voltage between a gate and a source of the driving element DT, and a second capacitor C2. The driving element DT and the switch elements M01, M02, M03, M04, and M05 may be implemented as N-channel oxide TFTs.

The light emitting element EL emits light by a current applied through a channel of the driving element DT according to a gate-source voltage Vgs of the driving element DT that varies according to a data voltage Vdata. The light emitting element EL may be implemented as an OLED including an organic compound layer formed between an anode and a cathode. The organic compound layer may include, but is not limited to, a hole injection layer (HIL), a hole transport layer (HTL), a light emitting layer (EML), an electron transport layer (ETL), and an electron injection layer (EIL). The anode of the light emitting element EL is connected to the driving element DT through a third node n3, and the cathode of the light emitting element EL is connected to a second power line 42 to which a low-potential power voltage EVSS is applied.

An organic light emitting diode used as the light emitting element may have a tandem structure in which a plurality of light emitting layers are stacked. The organic light emitting diode having the tandem structure may improve the luminance and lifespan of the pixel.

The driving element DT drives the light emitting element EL by supplying a current to the light emitting element EL according to a gate-source voltage Vgs. The driving element DT includes a gate connected to a first node n1, a first electrode (or drain) connected to a first power line, and a second electrode (or source) connected to a second node n2.

The first switch element M01 is turned on according to a gate-on voltage of an EM signal and connects the second electrode of the driving element DT to the anode of the light emitting element EL. The first switch element M01 includes a gate connected to a gate line to which the EM signal is applied, a first electrode connected to the second node n2, and a second electrode connected to a third node n3.

The second switch element M02 is turned on according to a gate-on voltage of a scan signal SCAN and connects a data voltage line to the first node n1 to apply a data voltage. The second switch element M02 includes a gate connected to a gate line to which the scan signal SCAN is applied, a first electrode connected to the data voltage line to which the data voltage is applied, and a second electrode connected to the first node n1.

The third switch element M03 is turned on according to a gate-on voltage of a sensing signal SENSE and connects the second node n2 to a reference voltage line. The third switch element M03 includes a gate connected to a gate line to which a sensing signal is applied, a first electrode connected to the second node n2, and a second electrode connected to a reference voltage line to which the reference voltage Vref is applied.

The fourth switch element M04 applies an initialization voltage responding to a first initialization signal INIT1. In this case, the initialization voltage is applied to the first node through an initialization voltage line. The fourth switch element M04 includes a gate to which the first initialization signal INIT1 is applied, a first electrode connected to the initialization voltage line, and a second electrode connected to the first node n1.

The fifth switch element M05 applies an anode voltage responding to a second initialization signal INIT2. In this case, the anode voltage is applied to the third node through an anode voltage line. The fifth switch element M05 includes a gate to which the second initialization signal INIT2 is applied, a first electrode connected to the third node n3, and a second electrode connected to the anode voltage line.

The first capacitor Cst is connected between the first node n1 and the third node n3. The first capacitor Cst charges the gate-source voltage Vgs of the driving element DT.

The second capacitor C2 is connected between a high potential voltage line and the second node n2.

A first gate signal and a second gate signal in which the phase of the first gate signal is reversed may be applied to a pixel circuit according to an embodiment. For example, the EM signal EM is formed as the first gate signal and applied to the gate of the first switch element M01, and the second initialization signal INIT2 is formed as the second gate signal and applied to the gate of the fifth switch element M05.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should include the following claims, and all technical concepts having equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A gate driver, comprising:
a plurality of signal transfer circuitry cascade-connected via a plurality of carry lines, each of the plurality of carry lines, in operation, outputting a carry signal to a respective first one of the plurality of signal transfer circuitry from a respective second one of the plurality of signal transfer circuitry that is previous the first one,
wherein an $n^{th}$ signal transfer circuitry of the plurality of signal transfer circuitry includes:
first output circuitry configured to output a first gate signal to a first output node according to voltages of a first control node and a second control node, the first control node being configured to pull up an output voltage, the second control node being configured to pull down the output voltage; and
second output circuitry configured to output a second gate signal to a second output node, the second gate signal having phase reverse that of the first gate signal,
wherein the second output circuitry includes:
a first pull-up transistor configured to output a high potential voltage to the second output node according to a voltage of a second control node of $(n-i)^{th}$ signal transfer circuitry; and
a first pull-down transistor configured to output a first low potential voltage to the second output node according to a voltage of a first control node of $(n+j)^{th}$ signal transfer circuitry,
wherein n is a positive integer, i is a positive integer less than n, and j is a positive integer.

2. The gate driver of claim 1, wherein the first output circuitry comprises:
a second pull-up transistor configured to output the high potential voltage to the first output node according to a voltage of the first control node of the $n^{th}$ signal transfer circuitry; and
a second pull-down transistor configured to output the first low potential voltage to the first output node according to a voltage of the second control node of the $n^{th}$ signal transfer circuitry.

3. The gate driver of claim 1, further comprising:
a first switch element connected between a first node and the first control node of the $(n+j)^{th}$ signal transfer circuitry, the first node being connected to a gate of the first pull-down transistor; and
a second switch element connected between the first node and a second node having a second low potential voltage, the second switch element having a gate connected to the second control node of the $(n-i)^{th}$ signal transfer circuitry.

4. The gate driver of claim 3, wherein:
the first pull-up transistor is turned on when a high voltage is applied to the second control node of the $(n-i)^{th}$ signal transfer circuitry; and
the first pull-down transistor is turned off by the second switch element being turned on when the high voltage is applied to the second control node of the $(n-i)^{th}$ signal transfer circuitry.

5. The gate driver of claim 3, wherein:
the first pull-up transistor is turned off when a low voltage is applied to the second control node of the $(n-i)^{th}$ signal transfer circuitry; and the first pull-down transistor is turned on by the second switch element being turned off when the low voltage is applied to the second control node of the $(n-i)^{th}$ signal transfer circuitry.

6. The gate driver of claim 5, wherein:
the first switch element is turned on when a high voltage is applied to the first control node of the $(n+j)^{th}$ signal transfer circuitry; and
the first pull-down transistor is turned on by the second switch element being turned off when the high voltage is applied to the first control node of the $(n+j)^{th}$ signal transfer circuitry.

7. The gate driver of claim 3, wherein a section to which a pulse of a high voltage of the second gate signal is applied is formed to be at least one horizontal period longer than a section to which a pulse of a low voltage of the first gate signal is applied.

8. The gate driver of claim 7, wherein the section to which the pulse of the high voltage of the second gate signal is applied is formed to be at least one horizontal period longer based on at least one edge of a rising edge and a falling edge of the section to which the pulse of the low voltage of the first gate signal is applied.

9. The gate driver of claim 1, wherein the $n^{th}$ signal transfer circuitry further comprises:
first circuitry configured to charge the first control node of the $n^{th}$ signal transfer circuitry by receiving the carry signal of signal transfer circuitry previous to the $n^{th}$ signal transfer circuitry;
second circuitry including an inverter circuit configured to discharge the second control node of the $n^{th}$ signal transfer circuitry according to the voltage of the first control node of the $n^{th}$ signal transfer circuitry; and
third circuitry configured to output the carry signal of the $n^{th}$ signal transfer circuitry to a third output node according to the voltages of the first control node of the $n^{th}$ signal transfer circuitry and the second control node of the $n^{th}$ signal transfer circuitry.

10. A display panel, comprising:
a data driver configured to output a data voltage;
a gate driver including a plurality of signal transfer circuitry cascade-connected via a plurality of carry lines, each of the plurality of carry lines, in operation, outputting a carry signal to a respective first one of the plurality of signal transfer circuitry from a respective second one of the plurality of signal transfer circuitry that is previous the first one,
wherein an $n^{th}$ signal transfer circuitry of the plurality of signal transfer circuit includes:
first output circuitry configured to output a first gate signal to a first output node according to voltages of a first control node and a second control node, the first control node being configured to pull up an output voltage, the second control node being configured to pull down the output voltage; and
second output circuitry configured to output a second gate signal to a second output node, the second gate signal having phase reverse that of the first gate signal; and
a plurality of pixel circuits configured to reproduce an input image by receiving the data voltage, the first gate signal, and the second gate signal,
wherein the second output circuitry includes:
a first pull-up transistor configured to output a high potential voltage to the second output node according to a voltage of a second control node of $(n-i)^{th}$ signal transfer circuitry; and
a first pull-down transistor configured to output a first low potential voltage to the second output node according to a voltage of a first control node of $(n+j)^{th}$ signal transfer circuitry,
wherein n is a positive integer, i is a positive integer less than n and j is a positive integer.

11. The display panel of claim 10, wherein the first output circuitry comprises:
a second pull-up transistor configured to output the high potential voltage to the first output node according to a voltage of the first control node of the $n^{th}$ signal transfer circuitry; and
a second pull-down transistor configured to output the first low potential voltage to the first output node according to a voltage of the second control node of the $n^{th}$ signal transfer circuitry.

12. The display panel of claim 10, further comprising:
a first switch element connected between a first node and the first control node of the $(n+j)^{th}$ signal transfer circuitry, the first node being connected to a gate of the first pull-down transistor; and
a second switch element connected between the first node and a second node having a second low potential voltage, the second switch element having a gate connected to the second control node of the $(n-i)^{th}$ signal transfer circuitry.

13. The display panel of claim 12, wherein:
the first pull-up transistor is turned on when a high voltage is applied to the second control node of the $(n-i)^{th}$ signal transfer circuitry; and
the first pull-down transistor is turned off by the second switch element being turned on when the high voltage is applied to the second control node of the $(n-i)^{th}$ signal transfer circuitry.

14. The display panel of claim 12, wherein:
the first pull-up transistor is turned off when a low voltage is applied to the second control node of the $(n-i)^{th}$ signal transfer circuitry; and
the first pull-down transistor is turned on by the second switch element being turned off when the low voltage is applied to the second control node of the $(n-i)^{th}$ signal transfer circuitry.

15. The display panel of claim 14, wherein:
the first switch element is turned on when a high voltage is applied to the first control node of the $(n+j)^{th}$ signal transfer circuitry; and
the first pull-down transistor is turned on by the second switch element being turned off when the high voltage is applied to the first control node of the $(n+j)^{th}$ signal transfer circuitry.

16. The display panel of claim 10, wherein a section to which a pulse of a high voltage of the second gate signal is applied is formed to be at least one horizontal period longer than a section to which a pulse of a low voltage of the first gate signal is applied.

17. The display panel of claim 16, wherein the section to which the pulse of the high voltage of the second gate signal is applied is formed to be at least one horizontal period longer based on at least one edge of a rising edge and a falling edge of the section to which the pulse of the low voltage of the first gate signal is applied.

18. The display panel of claim 10, wherein the $n^{th}$ signal transfer circuitry further comprises:
first circuitry configured to charge the first control node of the $n^{th}$ signal transfer circuitry by receiving the carry signal of signal transfer circuitry previous to the $n^{th}$ signal transfer circuitry;

second circuitry including an inverter circuit configured to discharge the second control node of the $n^{th}$ signal transfer circuitry according to the voltage of the first control node of the $n^{th}$ signal transfer circuitry; and third circuitry configured to output the carry signal of the $n^{th}$ signal transfer circuitry to a third output node according to the voltages of the first control node of the $n^{th}$ signal transfer circuitry and the second control node of the $n^{th}$ signal transfer circuitry.

19. The display panel of claim 10, wherein all transistors in the display panel including the data driver, the gate driver, and the pixel circuits are respective oxide thin film transistors including an n-channel type oxide semiconductor.

20. The display panel of claim 10, wherein each of the plurality of pixel circuits includes:
   a light emitting element;
   a driving element for supplying current to the light emitting element;
   a plurality of switch elements for switching a current path connected to the driving element;
   a first capacitor for storing a voltage between a gate and a source of the driving element, and
   a second capacitor.

21. A display device comprising:
   a timing controller; and
   a display panel including:
      a gate driver positioned in a bezel area of the display panel, the gate driver including:
         first signal transfer circuitry including:
            first circuitry having a first control node and a second control node; and
            first output circuitry coupled to the first and second control nodes;
         second signal transfer circuitry including:
            second circuitry having a third control node and a fourth control node; and
            second output circuitry coupled to the third and fourth control nodes; and
         third signal transfer circuitry connected between the first signal transfer circuitry and the second signal transfer circuitry, the third signal transfer circuitry including:
            third circuitry having a fifth control node and a sixth control node;
            third output circuitry configured to output a first gate signal to a first output node according to voltages of the fifth control node and the sixth control node, the fifth control node being configured to pull up the first gate signal, the sixth control node being configured to pull down the first gate signal; and
            fourth output circuitry configured to output a second gate signal to a second output node, a pulse width of the second gate signal being at least one horizontal period longer than a pulse width of the first gate signal, the fourth output circuitry including:
               a first pull-up transistor coupled to the second control node; and
               a first pull-down transistor coupled to the third control node.

* * * * *